United States Patent [19]

Bagdasarov et al.

[11] 4,013,421
[45] Mar. 22, 1977

[54] APPARATUS FOR GROWING SINGLE CRYSTALS OF HIGH-MELTING OXIDES

[76] Inventors: Khachik Saakovich Bagdasarov, Profsojuznaya ulitsa, 115, kv. 46; Nikolai Pavlovich Ilin, Leninsky prospekt, 44, kv. 260, both of Moscow; Jury Alexandrovich Starostin, Leninsky raion, poselok Gazoprovod, 1, kv. 4, Moskovskaya oblast, all of U.S.S.R.

[22] Filed: Dec. 30, 1974

[21] Appl. No.: 537,571

[52] U.S. Cl. .............. 23/273 SP; 156/617 H; 156/617 R; 13/16; 13/DIG. 1
[51] Int. Cl.² .............. B01J 17/08; H05B 5/12
[58] Field of Search ............ 23/273 SP, 301 SP; 156/616, 616 H, 616 A; 13/16, DIG. 1

[56] References Cited

UNITED STATES PATENTS

| 2,933,384 | 4/1960 | Welker et al. | 23/308 X |
| 3,139,653 | 7/1964 | Orem | 23/273 SP X |
| 3,273,969 | 9/1966 | Sirgo | 23/273 SP |
| 3,401,021 | 9/1968 | Tiller et al. | 23/273 SP |
| 3,401,022 | 9/1968 | Marshall et al. | 23/273 SP |

FOREIGN PATENTS OR APPLICATIONS

| 1,171,560 | 1/1959 | France | 23/301 SP |
| 1,023,023 | 1/1958 | Germany | 23/301 SP |
| 99,933 | 9/1973 | Germany | |
| 1,383,400 | 2/1975 | United Kingdom | 156/616 |

Primary Examiner—R.E. Serwin
Assistant Examiner—Michael S. Marcus
Attorney, Agent, or Firm—Steinberg & Blake

[57] ABSTRACT

An apparatus in which a system of sheet screens surrounding the heating zone has an internal layer of tungsten rods extending towards the exit of the boat from the apparatus to define an annealing chamber. The coils of the heater are arranged so that the number of the heater sections under and above the boat is different to ensure uniform heating of the melt, the ends of the heater rods being clamped in the current lead buses and secured by means of locking pins.

4 Claims, 3 Drawing Figures

APPARATUS FOR GROWING SINGLE CRYSTALS OF HIGH-MELTING OXIDES

The present invention relates to crystallography, and more particularly to growing monocrystalline lamellae of high-melting oxides by the method of directional crystallization in metal boats.

There are known apparatus for growing high-melting single crystals from a melt in boats, which are made as horizontal installations comprising a crystallization chamber accommodating a heater with a system of screens; compartments communicating with said chamber, arranged externally therof on a common axis on either side of the crystallization chamber so that one of the compartments may be disconnected from the chamber and turned by means of a swivel carriage, the apparatus also comprising a boat driving mechanism, evacuating, supercharging and water-cooling systems, a power supply and temperature regulators (cf. USSR Inventor's Certificate No. 276,921, Aug. 19, 1968).

A disadvantage inherent in the prior art apparatus is the impossibility of growing bigger monocrystalline plates, as required for a number of industries. In addition, the quality of the crystals grown in such apparatus is in some cases below the standard.

It is an object of the present invention to provide an apparatus for growing single crystals with uniform heating of the melt being crystallized in a boat.

Another object of the invention is to provide an apparatus for growing bigger single crystals as compared to those grown in the prior art apparatus of this kind.

Still another object of the invention is to provide an apparatus for growing single crystals of a higher quality and homogeneous structure.

Yet another object of the invention is to provide an apparatus for growing single crystals, characterized by high reliability in operation.

A further object of the invention is to provide a simple and inexpensive apparatus for growing single crystals noted for the above improvements.

These and other objects are attained in an apparatus for growing single crystals of high-melting oxides in the form of lamellae, by crystallizing a melt in a metal boat, comprising a crystallization chamber, a rod-type resistance heater accommodated in said crystallization chamber, connected to current leads and made in the form of coils surrounding said boat and arranged in planes normal to the boat axis, and a drive adapted to linearly move said boat with the melt through said heater, surrounded by a multilayer system of sheet screens, wherein, according to the invention, said system of sheet screens includes an internal layer of screens, said internal layer being composed of rods of a refractory metal, adjoining one another along the entire length thereof and arranged in the heater zone so as to define an elongated space serving as an annealing chamber near the exit of the boat from the heater, the latter having its ends clamped in said current leads by metal clamps and its coils being arranged so that the heater sections under and above said boat provide for uniform heating of the melt.

Such an embodiment ensures uniform heating of the melt in the boat and permits annealing during crystal growth as the boat is being removed from the heater.

According to an alternative embodiment of the present invention, the apparatus for growing single crystals is characterized in that the rod-type resistance heater is wound to define the residence zone of the boat with the melt in such a fashion that its coils are not complete, and in the bottom portion, where the melt is heated through the material of the boat, the number of rods is greater than in the top portion, wherefrom the melt is heated directly.

This feature represents an optimum way of winding the resistance heater to ensure uniform heating of the melt in the boat from top and bottom.

In accordance with yet another embodiment, the apparatus for growing single crystals is characterized in that to ensure clamping of the ends of the rod-type heater, each current lead is made in the form of two parallel plates having a common hole for the ends of the heater to be fitted therein and adapted to be moved apart to ensure clamping of the heater ends in this hole, said plates (buses) being provided with a means for locking them in the position which they occupy when moved apart.

This feature ensures reliable supply of current to the ends of the rod-type resistance heater, precludes sparking caused by poor contact and facilitates as well as speeds up assembling and disassembling of the rod-type heater.

According to a further embodiment, the proposed apparatus is characterized in that the buses are provided, at two points on either side of the common hole accommodating the heater ends, in the lengthwise direction, with eccentric locking pins.

This feature is a further improvement over the above-mentioned prior art embodiment and ensures securing of the current leads in the required position.

In accordance with still another embodiment of the present invention, the apparatus for growing single crystals is characterized in that the rods making up the internal screen and defining the annealing chamber are arranged parallel to the boat axis.

This embodiment of the annealing chamber is most efficient and structurally simple with the present arrangement of the system of heat screens.

And, finally, according to one more embodiment, the apparatus is characterized in that the rods making up the internal screen are made of tungsten, have a thickness exceeding that of the sheet screens and are closely adjacent to the rods screening the heating chamber to preserve as much heat as possible for the melt being removed from the crystallization chamber.

This particular feature permits preserving the heat from the heater in the tungsten rods of the internal screen for a longer period of time, and utilization of this heat from the heating zone for annealing in the course of the crystal growth.

The invention will now be described in greater detail with reference to a preferred embodiment thereof, taken in conjunction with the accompanying drawings, wherein.

Figure 1:
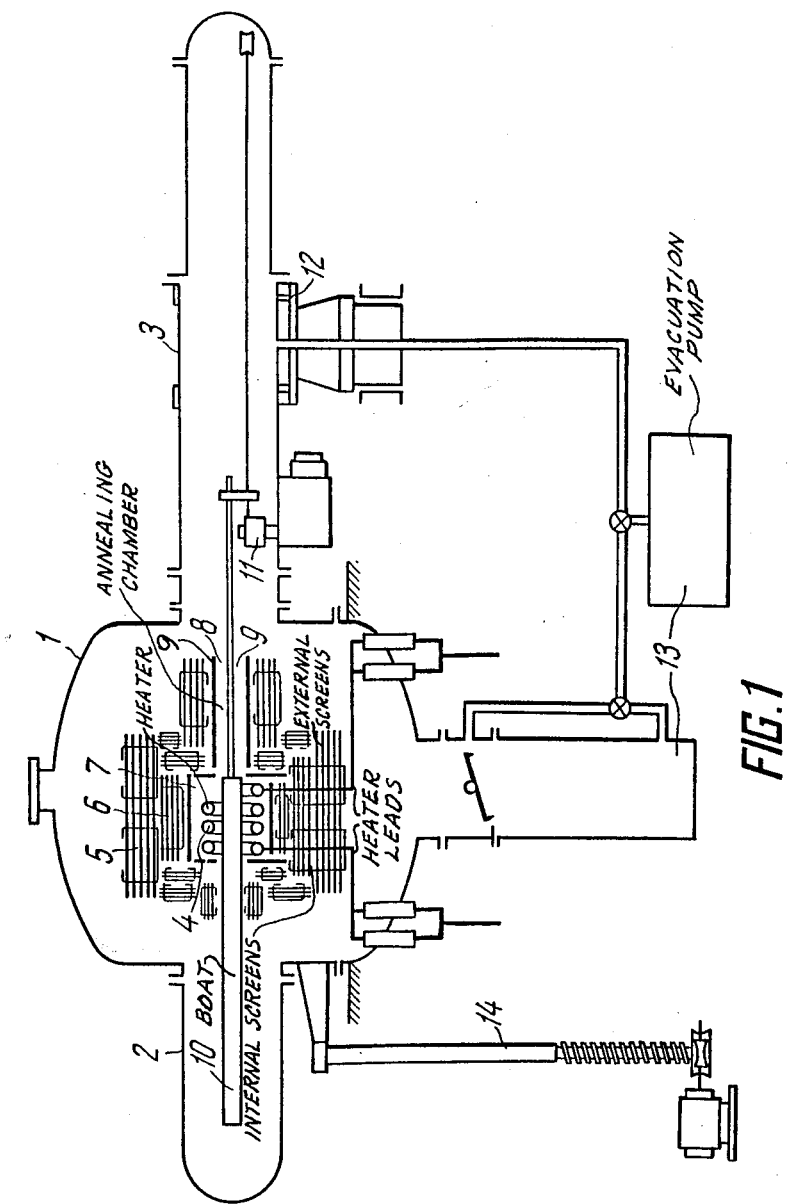
FIG. 1 shows schematically an apparatus for growing single crystals, according to the invention.

Referring now to FIG. 1, the apparatus for growing single crystals comprises a crystallization chamber 1, an entrance compartment 2, a receiving compartment 3, a heater 4, a system of screens including external screens 5 and internal screens 6 defining a heating chamber 7 and an annealing chamber 8 the inner walls of both chambers being lined with rods 9, a boat 10, a boat driving mechanism 11, a swivel carriage 12 and an evacuation pump 13.

During maintenance and repair of the screens, the crystallization chamber 1 together with entrance compartment 2 are lifted by means of a jack 14 and appropriately turned in a horizontal plane.

Figure 2:
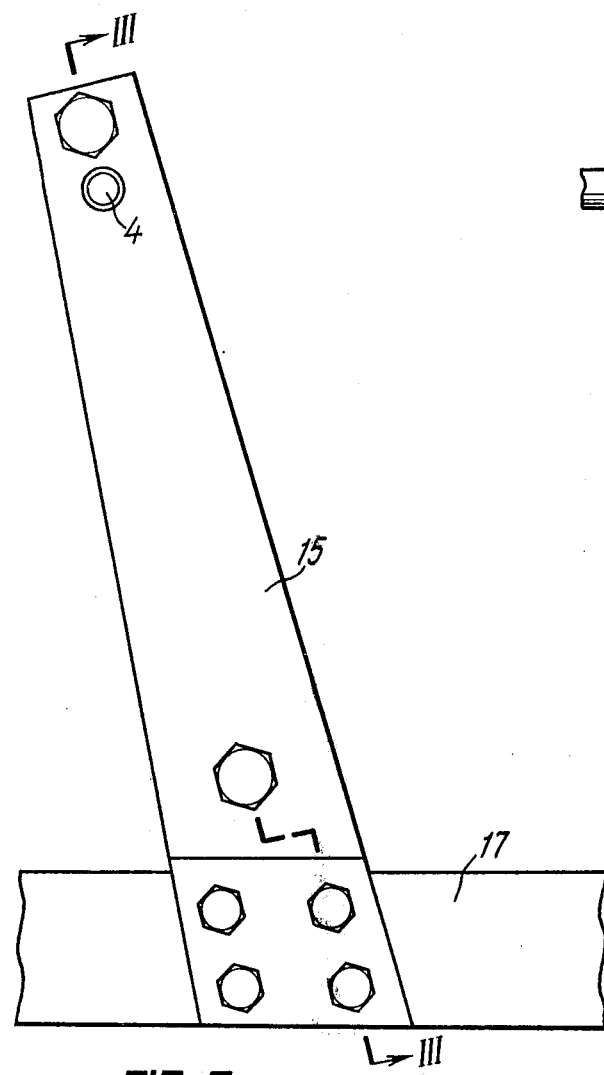
FIG. 2 illustrates the means for securing the ends of the heater in the current leads, according to the invention.
Figure 3:
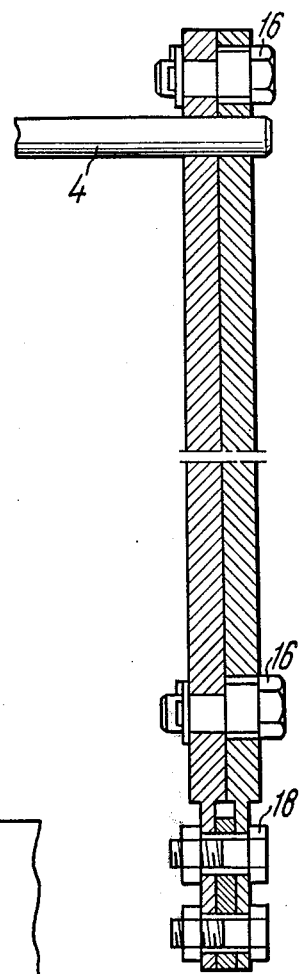
FIG. 3 is a section view taken along line III—III of FIG. 2.

FIG. 2 illustrates the manner in which the ends of the heater 4 are secured to current leads 15. The required tension is ensured by turning eccentric pins 16, whereafter the leads are bolted to buses 17 at 18.

The apparatus operates as follows. The boat 10 with the starting material is placed in the entrance compartment 2 with the aid of the boat driving mechanism 11. First, the evacuation and cooling systems are switched on, then the power supply to the heater and temperature regulators. This done, the driving mechanism of the boat 10 is actuated and the boat traverses the crystallization chamber 1 at a definite speed and enters the receiving section 3. After the system has been cooled to the required temperature, it is depressurized, the receiving compartment 3 is disconnected from the crystallization chamber 1, turned and the boat with the grown crystal is removed therefrom.

It should be noted that in this case the annealing chamber 8 is made up of parallel rods of the internal screens 6, contacting one another along their entire length. These rods are made of a refractory material, preferably tungsten, the annealing chamber 8 proper being in the form of an elongated space defined by sections of the internal screens 6. In the zone of the annealing chamber 8, the tungsten rods have a thickness exceeding that of the external sheet screens 5 and are closely adjacent to the rods which effect thermal shielding of the heating chamber. All this allows the heat evolved by the heater in the course of crystallization to be accumulated within the space defined by the internal screens 6 so that when the boat is removed from the heater, this heat would exert a prolonged action upon the crystal being grown, thereby annealing it in the process of growth; the rods of the annealing chamber 8 are arranged parallel to the boat axis as well as to the direction of its progressive motion as it is being removed from the heating chamber.

According to the invention, the coils of the rod-type heater 4 defining the residence zone of the boat 10 with the melt in the form of incomplete sections are unevenly distributed above and below the boat 10. The number of coil sections below the boat exceeds that thereabove so as to ensure uniform heating of the melt from top and bottom. From top, the melt is heated directly by the heater 4, while from bottom the heater 4 heats the melt through the material of the boat and that of the support (not shown) on which the boat 10 is placed.

Evidently, uniform heating of the melt can be achieved not only by appropriately distributing the heater coil sections above and below the boat, but also by making the rod-type heater sections of different thickness, by different arrangement of the heater coils, and in any other suitable manner.

The rod-type heater 4 should preferably be made welded of separate rods of a refractory material, this feature rendering the heater easy in manufacture and enabling the heater to be made of any most intricate shape as may be desired. This permits of not only providing a different number of heater sections above and below the boat, but also of taking into account the interaction of the currents flowing through adjacent coils of the heater so as to avoid deformation of the heater in operation these currents. This can be avoided accomplished, e.g. by a staggered arrangement of the coils, with respect to their cross-section area, and by adequately spacing the coils passing current in a common or opposite directions.

As has been already mentioned above, the ends of the rod-type heater 4 are secured to the current leads by means of metal clamps. This is required to ensure reliable contact, to avoid sparking and to facilitate replacement and repair of the heater. The current leads are provided, each, with a pair of parallel of current-conducting plates 15 adapted to be moved apart (in the scissors-like manner) and connected to the bus 17. Made in the plates 15 are coaxial holes aligned to accommodate the ends of the rod-type heater 4. When the plates 15 are moved apart and secured in position with the aid of the eccentric locking pins 16, the ends of the heater 4 are reliably clamped in the holes of the plates 15.

Although the apparatus for growing single crystals has been disclosed herein with reference to a specific embodiment thereof, it should be clear to those skilled in the art that the essence of the present invention resides in providing for adequate annealing of the single crystal being grown directly in the course of its growth and ensuring uniform heating of the melt over the entire cross-sectional area thereof, as has been mentioned above.

It is to be understood that the invention is not limited to the specific embodiment herein illustrated and described, but may be used in other ways without departure from its spirit and scope.

What is claimed is:

1. An apparatus for growing single crystals of high-melting oxides in the form of lamellae, by crystallizing a melt in a boat, comprising: a crystallization chamber; a resistance heater accommodated in said crystallization chamber and composed of a coil having turns made of a rod material; current leads connected to an external power supply and having clamp means for securing said leads to ends of said heater for supplying power thereto; a metal boat containing the melt being crystallized; driving means for moving said metal boat with the melt through the coil turns of the resistance heater, said turns surrounding the boat when the latter is placed in the heater of the crystallization chamber and being arranged in planes normal to the boat axis and having incomplete sections distributed with a greater number of said sections in a bottom portion, where the melt is heated through the material of the boat, than in a top portion, where the melt is heated directly, with the result that the bottom and top portions of the turns ensure uniform heating of the melt in the boat; a multilayer system of sheet screens surrounding said resistance heater and including an internal layer of said screens, nearest to said resistance heater, made up of rods of a refractory material, adjoining one another along the entire length thereof and extending beyond the heater and defining beyond the heater an elongated space serving as an annealing chamber near the exit of the boat from the space defined by the coil turns of the heater, said current leads each include two parallel plates respectively having aligned holes for an end of the heater to be fitted therein and said plates being movable apart to ensure clamping of the heater end in said holes, and lock means connected with said plates for locking them in the position which they occupy when moved apart.

2. An apparatus for growing single crystals as claimed in claim 1, wherein the plates are provided, at two locations on either side of the aligned holes accommodating the heater end, with eccentric locking pins forming said lock means.

3. An apparatus for growing single crystals as claimed in claim 1, wherein the rods making up the internal screen and defining the annealing chamber are arranged parallel to the boat axis.

4. An apparatus for growing single crystals as claimed in claim 3, wherein the rods making up the internal screen are made of tungsten, have a thickness exceeding that of the sheet screens and are closely adjacent to the rods screening the heating chamber to preserve as much heat as possible for the melt being removed from the crystallization chamber.

* * * * *